United States Patent
Liang et al.

(10) Patent No.: US 8,494,804 B2
(45) Date of Patent: Jul. 23, 2013

(54) SYSTEM AND METHOD FOR GENERATING A TEST FILE OF A PRINTED CIRCUIT BOARD

(75) Inventors: Hsien-Chuan Liang, Taipei Hsien (TW); Shen-Chun Li, Taipei Hsien (TW); Shou-Kuo Hsu, Taipei Hsien (TW); Yung-Chieh Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 552 days.

(21) Appl. No.: 12/728,257

(22) Filed: Mar. 21, 2010

(65) Prior Publication Data

US 2011/0035178 A1 Feb. 10, 2011

(30) Foreign Application Priority Data

Aug. 7, 2009 (CN) .......................... 2009 1 0305372

(51) Int. Cl.
*G01R 31/00* (2006.01)
*G01R 15/00* (2006.01)
*G06F 17/50* (2006.01)

(52) U.S. Cl.
USPC ............................. 702/119; 702/57; 716/100

(58) Field of Classification Search
USPC ................. 702/119, 57, 64; 324/537, 750.01, 324/750.15; 716/136, 137, 139, 100
See application file for complete search history.

(56) References Cited

U.S. PATENT DOCUMENTS

| 7,263,682 | B2 * | 8/2007 | Tsai et al. ...................... 716/112 |
| 7,321,885 | B2 * | 1/2008 | Loh ................................ 706/47 |
| 2005/0262455 | A1 * | 11/2005 | Wu et al. ........................... 716/4 |
| 2006/0236276 | A9 * | 10/2006 | Frank et al. ....................... 716/5 |

FOREIGN PATENT DOCUMENTS

CN 101364174 A 2/2009

* cited by examiner

*Primary Examiner* — Marc Armand
*Assistant Examiner* — Ricky Ngon
(74) *Attorney, Agent, or Firm* — Altis Law Group, Inc.

(57) ABSTRACT

A system and method generates a test file of a print circuit board (PCB). The system and method loads trace information of the PCB into a storage system of a test computer, searches the storage system for the trace information matching keywords received and selects traces to test from the searched results. The system and method further acquires length and test points of each selected trace, and sets test parameters of each test item. In addition, the system and method generates a test file of the PCB according to the test parameters, the length, and the test points of each selected trace.

12 Claims, 3 Drawing Sheets

SYSTEM AND METHOD FOR GENERATING A TEST FILE OF A PRINTED CIRCUIT BOARD

BACKGROUND

1. Technical Field

Embodiments of the present disclosure relates to printed circuit board (PCB) testing methods, and more particularly to a system and method for generating a test file of the PCB using a test computer.

2. Description of Related Art

PCBs provide a mechanism to implement a circuit design (i.e., the interconnection of electrical devices and components) for use, for example, in a computer system. It is very important to test a PCB during the production process. For example, testing resistances on a trace of the PCB may be done during one test procedure. At present, testing of the PCB is usually done manually where traces are manually selected to be tested. These traces are then calculated to arrange information of the PCB, so as to input test parameters. This process is very time consuming and can lead to human error.

Therefore, there is a need for an improved system and method to address the above-mentioned problems.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one. In general, the word "module," as used herein, refers to logic embodied in hardware or firmware, or to a collection of software instructions, written in a programming language, such as, for example, Java, C, or Assembly. One or more software instructions in the modules may be embedded in firmware, such as an EPROM. The modules described herein may be implemented as either software and/or hardware modules and may be stored in any type of computer-readable medium or other storage device.

Figure 1:
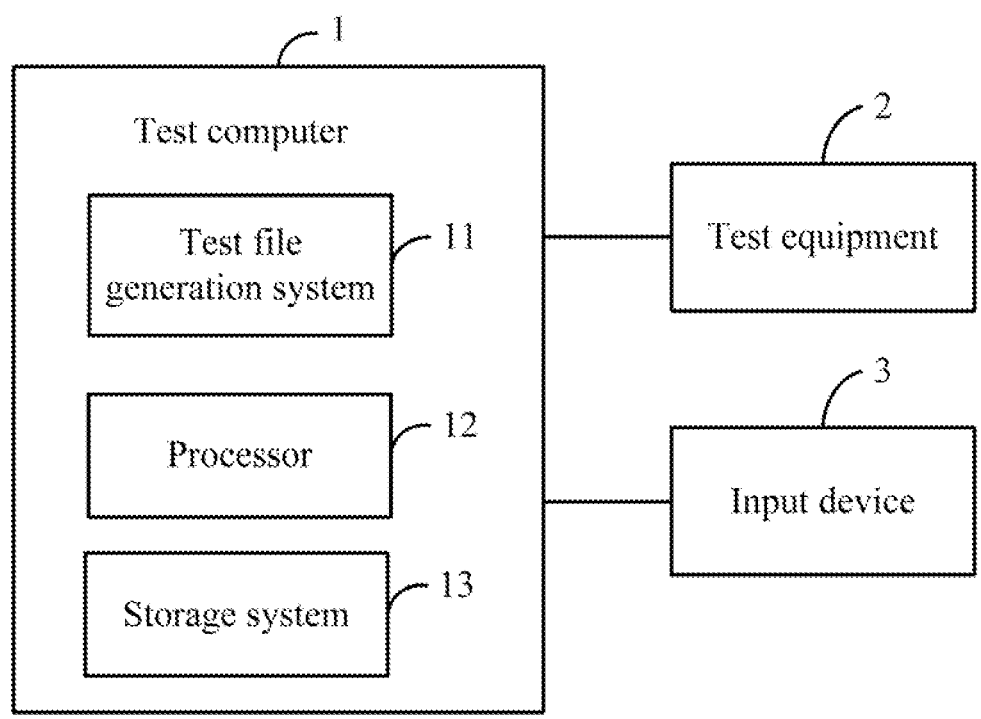
FIG. 1 is a block diagram of one embodiment of a test computer comprising a test file generation system.

FIG. 1 is a block diagram of one embodiment of a test computer 1 comprising a test file generation system 11. In the embodiment, the test computer 1 connects to a test equipment 2 and an input device 3. The test equipment 2 is used to test each test item of a printed circuit board (PCB), when a test file of the PCB is generated by the test computer 1. The test equipment 2 may be a test fixture to test the test item automatically. The input device 2 is used to input data during the process of generating the test file of the PCB. The test item is an electrical characteristic of a component on a trace of the PCB, and the electrical characteristic may be resistance, capacitance, inductance, voltage, current, power, or temperature of the component. In the embodiment, the test computer 1 may further include a processor 12, and a storage system 13. It should be apparent that FIG. 1 is only one example of the test computer 1 disclosure and can be included with fewer or more components than shown in other embodiments, or a different configuration of the various components.

The processor 12 executes a plurality of computerized operations of the test computer 1 and other applications, to provide functions of the test computer 1. The storage system 13 stores a plurality of programs, such as programs of an operating system, and various information of the PCB. In one embodiment, the storage system 13 may be random access memory (RAM) for temporary storage of information, and/or a read only memory (ROM) for permanent storage of information. In other embodiments, the storage system 13 may also be an external storage device, such as a hard disk, a storage card, or a data storage medium.

The test file generation system 11 generates a test file of the PCB. The test file may be loaded into the test equipment 2 to preset a plurality of test parameters for each test item of the PCB before the test procedure, to test the test item of the PCB automatically. The test file is also a reference document, which analyzes the test results of the test item. The test parameters include trace information of each trace need to be tested, such as name, signal type, length, test points, tolerance, and standard test value for to get a test result of each of the traces.

Figure 2:
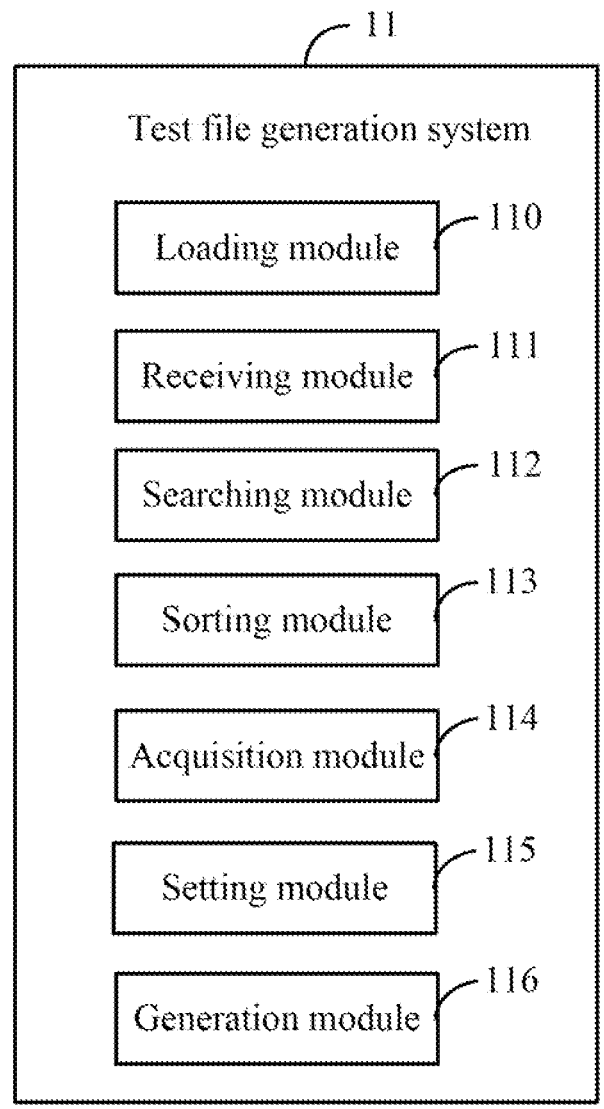
FIG. 2 is a block diagram of one embodiment of functional modules of the test file generation system in FIG. 1.

FIG. 2 is a block diagram of one embodiment of functional modules of the test file generation system 11 in FIG. 1. In one embodiment, the test file generation system 11 includes a loading module 110, a receiving module 111, a searching module 112, a sorting module 113, an acquisition module 114, a setting module 115, and a generation module 116. A plurality of computerized codes of the function modules 110-116 may be stored in the storage system 13, and executed by the processor 12 to perform operations of the test computer 1.

The loading module 110 loads trace information of the PCB into the storage system 13. The trace information of the PCB may include for example, the name, the signal type, each test item, the test points, and length of each trace. The test item is an electrical characteristic of a component on the traces to be tested. In one embodiment, the electrical characteristic of the component may be resistance, capacitance, inductance, voltage, current, power, or temperature of the component. The trace information may be written to a file after the production of the PCB is complete, and the file may be loaded into the storage system 13.

The receiving module 111 receives keywords of traces to be tested. The keywords may be input by a user through the input device 3 connected to the test computer 1. The input device 3 may be, for example, a mouse or a keyboard. The keywords may be one or more letters/words or names of the traces to be tested.

The searching module 112 searches the storage system 13 for trace information matching the keywords, and selects the traces to be tested from the searched results.

The sorting module 113 sorts the selected traces according to the signal type of each selected trace. The signal type of each trace may be a single-ended signal or a differential signal.

The acquisition module 114 acquires the length and the test points of each selected trace from the storage system 13. The test points are user predetermined after the production of the PCB is completed.

The setting module 115 sets a tolerance and a standard test value for each test item of the selected traces according to test requirements. In one embodiment, for example, the test item may be a resistance on a selected trace, the tolerance may be set as 10Ω, and the standard test value of the resistance may be set as 100Ω. If the test result of the resistance is greater than 90Ω and less than 110Ω, the test result of the resistance is acceptable.

The generation module 116 generates a test file of the PCB according to the set tolerance and the standard test value of each test item, the length, and the test points of each selected trace.

Figure 3:
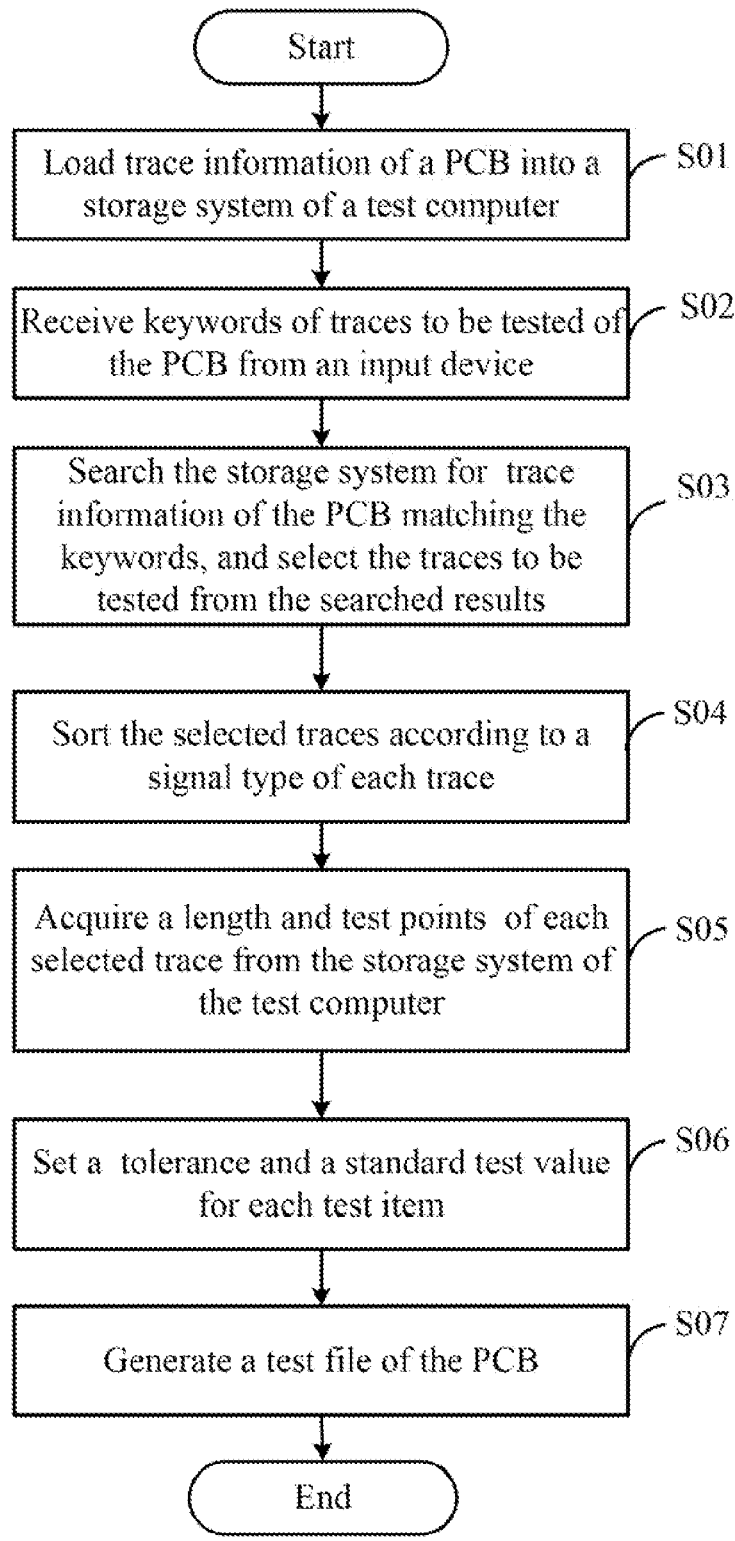
FIG. 3 is a flowchart of one embodiment of a method for generating a test file of a printed circuit board.

FIG. 3 is a flowchart of one embodiment of a method for generating a test file of a printed circuit board (PCB). Depending on the embodiment, additional blocks may be added, others removed, and the ordering of the blocks, may be changed.

In block S01, the loading module 110 loads trace information of the PCB into the storage system 13 of the test computer 1. The trace information of the PCB may include for example, the name, the signal type, the test item, the test points and the length of each trace.

In block S02, the receiving module 111 receives keywords of traces to be tested of the PCB. The keywords may be input by a user from the input device 3 connected to the test computer 1. The keywords may be one or more letters/words or names of the traces to be tested.

In block S03, the searching module 112 searches the storage system 13 for trace information matching the keywords, and selects the traces to be tested from the searched results.

In block S04, the sorting module 113 sorts the selected traces according to the signal type of each selected trace. The signal type of each trace may be a single-ended signal or a differential signal.

In block S05, the acquisition module 114 acquires the length and the test points of each selected trace from the storage system 13. The user determines the test points of the traces to test according to predetermined test requirements.

In block S06, the setting module 114 sets a tolerance and a standard test value for each test item of the selected traces according to test requirements.

In block S06, the generation module 116 generates a test file of the PCB according to the set tolerance and the standard test value of each test item, the length, and the test points of each selected trace. The test file may be loaded into the test equipment 2 to preset test parameters of the test item before the test procedure of the PCB starts, to test the test item of the PCB automatically, thereby avoiding human error and reducing test time. To test if the test results are acceptable, the test file may be used as a reference document for analyses.

All of the processes described above may be embodied in, and fully automated via, functional code modules executed by one or more general purpose processors of a computing device. The functional code modules may be stored in any type of readable medium or other storage devices. Some or all of the methods may alternatively be embodied in specialized computing devices.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A method for generating a test file of a printed circuit board (PCB) using a test computer, the test computer being connected to a test equipment, the method comprising:
    loading trace information of the PCB into a storage system of the test computer;
    receiving keywords of traces to be tested of the PCB through an input device;
    searching the storage system for the trace information matching the keywords, and selecting the traces to be tested from searched results;
    acquiring a length and test points of each selected trace from the storage system;
    setting a tolerance and a standard test value for each test item of each selected trace according to test requirements of each test item;
    generating a test file according to the set tolerance and the standard test value of each test item, the length, and the test points of each selected trace; and
    loading the test file into the test equipment to preset a plurality of test parameters for each test item of the PCB, and testing each test item of the PCB automatically according to the test file.

2. The method according to claim 1, wherein the trace information of the PCB comprises a name, a signal type, the length, and the test points of each trace of the PCB.

3. The method according to claim 2, further comprising:
    sorting the selected traces according to the signal type of each selected trace.

4. The method according to claim 1, wherein each test item is an electrical characteristic of a component on a selected trace, and the electrical characteristic is resistance, capacitance, inductance, voltage, current, power, or temperature of the component.

5. A system for generating a test file of a printed circuit board (PCB), the system comprising:
    a storage system;
    at least one processor to execute one or more programs stored in the storage system, the one or more programs comprising:
    a loading module operable to load trace information of the PCB into a storage system of the test computer;
    a receiving module operable to receive keywords of traces to be tested of the PCB from an input device;
    a searching module operable to search the storage system for the trace information matching the keywords, and selecting the traces to be tested from searched results;
    an acquisition module operable to acquire a length and test points of each selected trace from the storage system;
    a setting module operable to set a tolerance and a standard test value for each test item of each selected trace according to test requirements of each test item; and
    a generation module operable to generate a test file according to the set tolerance and the standard test value of each test item, the length, and the test points of each selected trace, the test file being loaded into a test equipment to preset a plurality of test parameters for each test item of the PCB, and testing each test item of the PCB automatically according to the test file.

6. The system according to claim 5, wherein the trace information of the PCB comprises a name, a signal type, the length, and the test points of each trace of the PCB.

7. The system according to claim 6, further comprising:
    a sorting module operable to sort the selected traces according to the signal type of each selected trace.

8. The system according to claim 5, wherein each test item is an electrical characteristic of a component on a selected trace, and the electrical characteristic is resistance, capacitance, inductance, voltage, current, power, or temperature of the component.

9. A non-transitory storage medium storing a set of instructions, the set of instructions capable of being executed by a processor of a test computer to perform a method for generating a test file of a printed circuit board (PCB), the test computer being connected to a test equipment, the method comprising:
    loading trace information of the PCB into a storage system of the test computer;

receiving keywords of traces to be tested of the PCB through an input device;

searching the storage system for the trace information matching the keywords, and selecting the traces to be tested from searched results;

acquiring a length and test points of each selected trace from the storage system;

setting a tolerance and a standard test value for each test item of each selected trace according to test requirements of each test item;

generating a test file according to the set tolerance and the standard test value of each test item, the length, and the test points of each selected trace; and loading the test file into the test equipment to preset a plurality of test parameters for each test item of the PCB, and testing each test item of the PCB automatically according to the test file.

10. The non-transitory storage medium as claimed in claim 9, wherein the trace information of the PCB comprises a name, a signal type, the length, and the test points of each trace of the PCB.

11. The non-transitory storage medium as claimed in claim 9, wherein the method further comprises:

sorting the selected traces according to the signal type of each selected trace.

12. The non-transitory storage medium as claimed in claim 9, wherein each test item is an electrical characteristic of a component on a selected trace, and the electrical characteristic is resistance, capacitance, inductance, voltage, current, power, or temperature of the component.

* * * * *